US006563325B2

(12) United States Patent
Streed et al.

(10) Patent No.: US 6,563,325 B2
(45) Date of Patent: May 13, 2003

(54) CONNECTOR FOR DIRECT CONNECTION TESTING OF ELECTRONICS DEVICES

(75) Inventors: Rodney W. Streed, Ramona, CA (US); Dale A. Arkwright, La Mesa, CA (US); Dung T. Tran, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 18 days.

(21) Appl. No.: 09/741,687

(22) Filed: Dec. 18, 2000

(65) Prior Publication Data

US 2002/0075010 A1 Jun. 20, 2002

(51) Int. Cl.[7] ........................ H01H 31/04; G01R 31/02; H01R 12/00

(52) U.S. Cl. ........................ 324/538; 324/761; 324/755; 439/63

(58) Field of Search ................................ 324/538, 755, 324/158.1, 761; 439/63, 67, 585, 675

(56) References Cited

U.S. PATENT DOCUMENTS

| | | | | | |
|---|---|---|---|---|---|
| 4,620,763 | A | | 11/1986 | Mochida | 439/275 |
| 4,718,745 | A | * | 1/1988 | Strait, Jr. | 350/96.21 |
| 4,927,986 | A | * | 5/1990 | Daly | 178/18 |
| 4,966,560 | A | * | 10/1990 | Marzouk | 439/585 |
| 4,979,312 | A | | 12/1990 | Wool | 33/513 |
| 5,545,059 | A | * | 8/1996 | Nelson | 439/583 |
| 5,551,080 | A | * | 8/1996 | Chambers et al. | 455/348 |
| 5,563,562 | A | * | 10/1996 | Szwec | 333/260 |
| 5,756,941 | A | * | 5/1998 | Snell | 178/18 |
| 5,945,835 | A | * | 8/1999 | McDonough et al. | 324/754 |
| 5,997,314 | A | * | 12/1999 | Wallace et al. | 439/63 |
| 6,350,155 | B1 | * | 3/2000 | Mullinger-Bausch et al. | 439/675 |
| 6,052,090 | A | * | 4/2000 | Simmons et al. | 343/702 |
| 6,113,397 | A | * | 9/2000 | Myers | 439/63 |

FOREIGN PATENT DOCUMENTS

| | | |
|---|---|---|
| DE | 29801175 | 4/1998 |

* cited by examiner

*Primary Examiner*—N. Le
*Assistant Examiner*—Wasseem H. Hamdan
(74) *Attorney, Agent, or Firm*—Philip R. Wadsworth; Charles D. Brown; Nicholas J. Pauley

(57) ABSTRACT

A test connector for the direct connection of electronic devices. The test connector may be mechanically and electrically connected to a testing device for insertion into a test port of an electronic device. The leading edge and the outer surface of the tip of the connector form a beveled shoulder so that insertion of the connector into a test port, misalignment of the wireless communication device with the test connector will not prevent proper insertion of the test connector into the test port. In addition, a wire encircles helically the outer surface of the tip of the test connector and functions as both a spring mechanism during the insertion of the test connector into the test port and as a grounding mechanism.

27 Claims, 5 Drawing Sheets

CONNECTOR FOR DIRECT CONNECTION TESTING OF ELECTRONICS DEVICES

FIELD OF THE INVENTION

The invention relates to a system and a method for testing wireless devices, such as wireless communication devices. More particularly, the invention relates to a system and a method for directly testing wireless devices by inserting a test connector into a test port of a wireless device.

DESCRIPTION OF THE RELATED ART

Wireless communication devices are becoming increasingly prevalent, with cellular telephones being a particularly notable example. With these devices, radio-frequency (RF) signals are transmitted and received to create a communication link between the device and another wireless device. During the manufacture of such devices, it is necessary to test functionally the RF signal generation and reception circuitry as well as the signal processing circuitry prior to shipment of the device to a customer.

In general, two testing schemes are available: transmission testing and direct connection testing. In transmission testing, signals are transferred between a test set-up antenna and an antenna on the device under test. Accurate transmission testing is difficult to achieve in a mass production environment due to the mutual interference generated by testing many devices within close proximity to one another. In direct connection testing, the device under test is equipped with an accessible test port which allows for the direct physical coupling of the device under test to a testing device. Using direct connection testing, the device under test can be electrically and mechanically connected to test equipment using a test connector. Consequently, direct connection testing avoids the wireless transmission of signals and so overcomes the difficulties of transmission testing due to the mutual interference caused by the transmission of RF signals by the test system and the multiple devices under test.

Direct connection testing has been achieved using a prior art test connector 100 such as that shown in FIG. 1. The prior art test connector 100 is intended to be permanently installed in the test equipment and to mate temporarily with the device under test during the testing process. Radiall, S. A. (101 Rue Philibert Hoffman, 93116 Rosny Sous Bois, France) manufactures the prior art test connector 100 (part number R191-977-500).

Referring to FIG. 1, the prior art test connector 100 has a cylindrical base 120 which is fixedly attached to the testing equipment. Mounted to the cylindrical base 120 is a body 130. The body 130 can have multiple planar faces in order to allow a tool, such as an adjustable or customized wrench, to secure the body 130 and rotate the prior art test connector 100, thereby allowing a user to install or to remove the prior art test connector 200 from testing equipment (not shown). Furthermore, a connector saver 140 has multiple planar faces in order to allow a tool, such as an adjustable or customized wrench, to secure the body 130 and rotate the prior art test connector 100, thereby allowing a user to install or to remove the prior art test connector 100. Furthermore, the connector saver 140 can act to protect the action of a tool from damaging the prior art test connector 100 when the prior art test connector 100 is inserted or removed from the testing equipment.

Attached to the body 130 is a cylindrical shaft 150 with a cylindrical tip 160 with dimensions corresponding to a test port on a device to be tested. During the testing process, the cylindrical tip 160 of the cylindrical shaft 150 is inserted into the test port of the device under test. RF test signals are transmitted to the device under test via a transmitter passing through the center of the prior art test connector 100. Once the prior art test connector 100 is inserted into the test port of the device under test, the transmitter mates with the test port to create an electrical connection and allow RF test signals to be transmitted to the device under test.

The prior art test connector 100 requires an accurate fit between the leading edge 180 of the cylindrical tip 160 and the inner wall of the test port (not shown) of the device under test in order to establish a ground path. The leading edge 180 of the cylindrical tip 160 of the prior art test connector 100 forms a ninety degree angle with a plane tangential to the outer surface of the cylindrical shaft 150. The nexus between the leading edge 180 of the cylindrical tip 160 and the outer surface of the cylindrical shaft 150 forms a shoulder 185 which is abrupt and only slightly rounded. The abrupt shoulder 185 closely matches the dimensions of the test port and therefore requires an extremely accurate insertion of the cylindrical tip 160 into the test port. Due to the sharp angles formed at the shoulder 185 of the cylindrical tip, even the slightest misalignment during insertion of the prior art test connector 100 into the test port of the device under test will prevent the cylindrical tip 160 from entering the test port. As a result, this configuration provides little or no tolerance for positional inaccuracy during insertion of the prior art test connector 100 into the test port of the device under test.

In a laboratory setting where the test equipment operator can manually insert the prior art test connector 100 into the device under the test, the prior art test connector 100 operates adequately. Manual insertion allows the operator to ensure that the prior art test connector 100 fits accurately into the test port of the device under test by allowing the operator to adjust the attachment angle and insertion pressure to ensure a proper connection.

In the mass production environment, however, the prior art test connector 100 proves to be unsatisfactory. Typically, in the mass production setting, the device under test is mounted on a moveable mechanism. The moveable mechanism moves the device under test into position whereby the prior art test connector 100 is automatically inserted into the test port of the device under test. The prior art test connector 100 is fixedly attached to the test equipment which is designed to adjust along both the both the X and Y axes. Consequently, automatic insertion of the prior art test connector 100 into the test port of the device under test is adjustable in only two directions. The mass production environment does not allow for careful re-alignment of individual devices under test. As a result, misalignment can result when the prior art test connector 100 is inserted into the test port during this automatic process. As discussed above, even slight misalignment can prevent proper insertion of the prior art test connector 100 into the test port of the device under test. As a result of improper or inadequate insertion of the prior art test connector 100 into the test port, the conductive material of the outer shell of the cylindrical tip 160 cannot electrically mate properly with the test port. Consequently, misalignment can fail to provide an adequate grounding path between the prior art test connector 100 and the test port ground of the device under test. Additionally, misalignment can lead to misleading variations in the test results due to an improper electrical mating and thereby can cause false test failures. Furthermore, due to the sharp angles of the shoulder 185 and the test port, improper alignment may also cause damage to the prior art test connector 100, the test equipment, or the device under test.

Thus, it will be appreciated that there is a need in the technology for a means and a method for providing a direct connection test system using a test connector which overcomes the described deficiencies in the prior art. The improvement should allow for proper automatic insertion of the test connector into the test port of the device under test. Additionally, the improvement should allow for a direct connection test system which provides accurate results and reduces damage to the device under test.

SUMMARY

One embodiment of the invention describes a connector for providing a direct connection from a test port of a device to a test device. The connector includes a base attached to the test device and having a hollow center, a body attached to the base and defining a shaft having a hollow center, a tip portion attached to the body opposite the base and having a hollow center and a leading edge, wherein the tip portion is configured to mate with the test port, a conductive material passing through the hollow center of the base, the body and the tip portion, wherein the conductive material provides an electrical coupling between the device to be tested and the test device when the tip portion is inserted into the test port, and a spring mechanism encircling the tip portion and configured to guide the tip portion into the test port during insertion.

BRIEF DESCRIPTION OF THE DRAWINGS

The features, objects, and advantages of the invention will become more apparent from the detailed description set forth below when taken in conjunction with the drawings in which like reference-characters identify correspondingly throughout and wherein.

DETAILED DESCRIPTION OF THE INVENTION

Preferred embodiments of the invention will now be described with reference to the accompanying figures. The terminology used in the description presented herein is intended to be interpreted in its broadest reasonable manner, even though it is being utilized in conjunction with a detailed description of certain specific preferred embodiments of the present invention. This is further emphasized below with respect to some particular terms. Any terminology intended to be interpreted by the reader in any restricted manner will be overtly and specifically defined as such in this specification.

Figure 1:
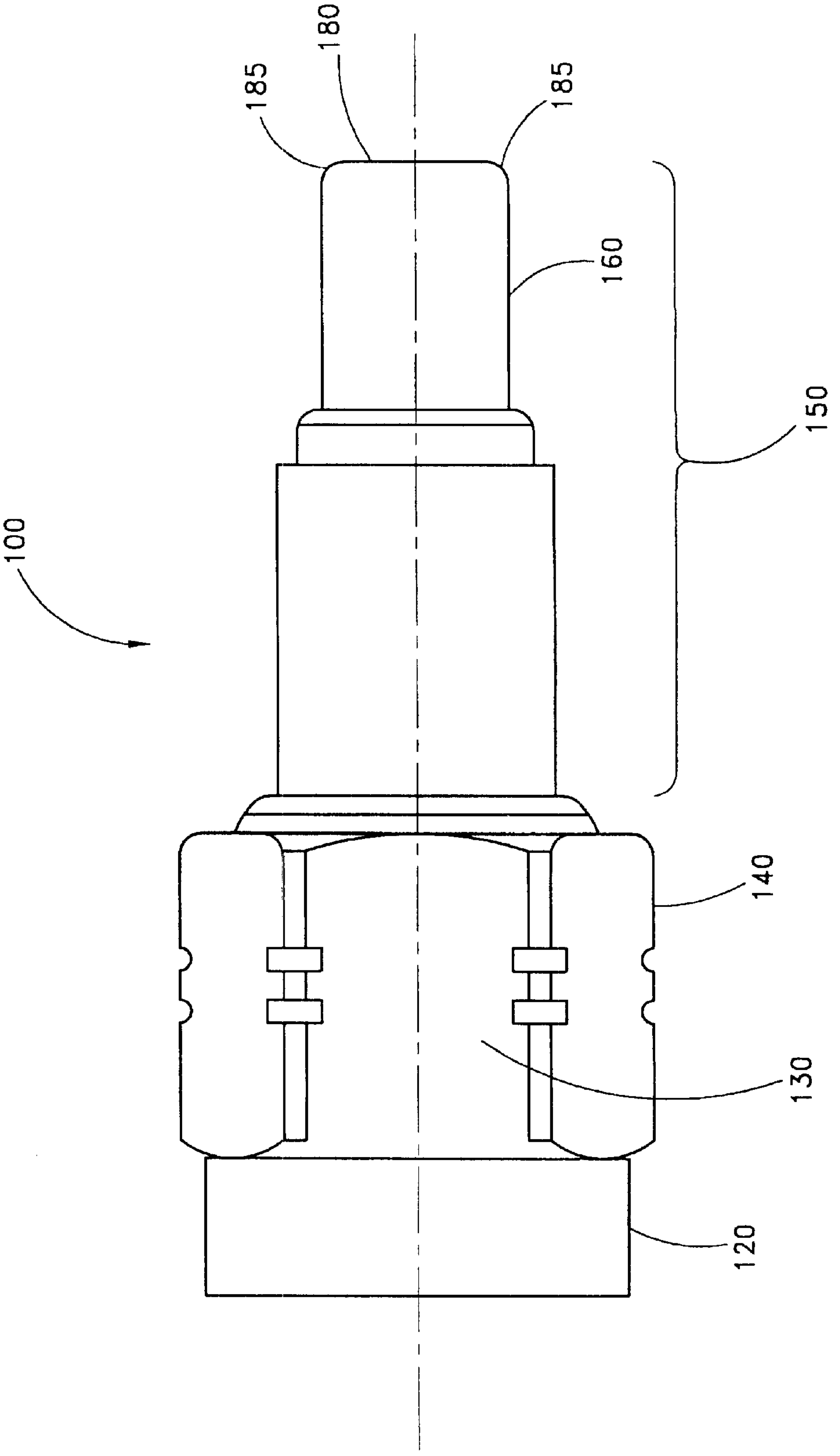
FIG. 1 is an elevational view of a prior art test connector.
Figure 2:
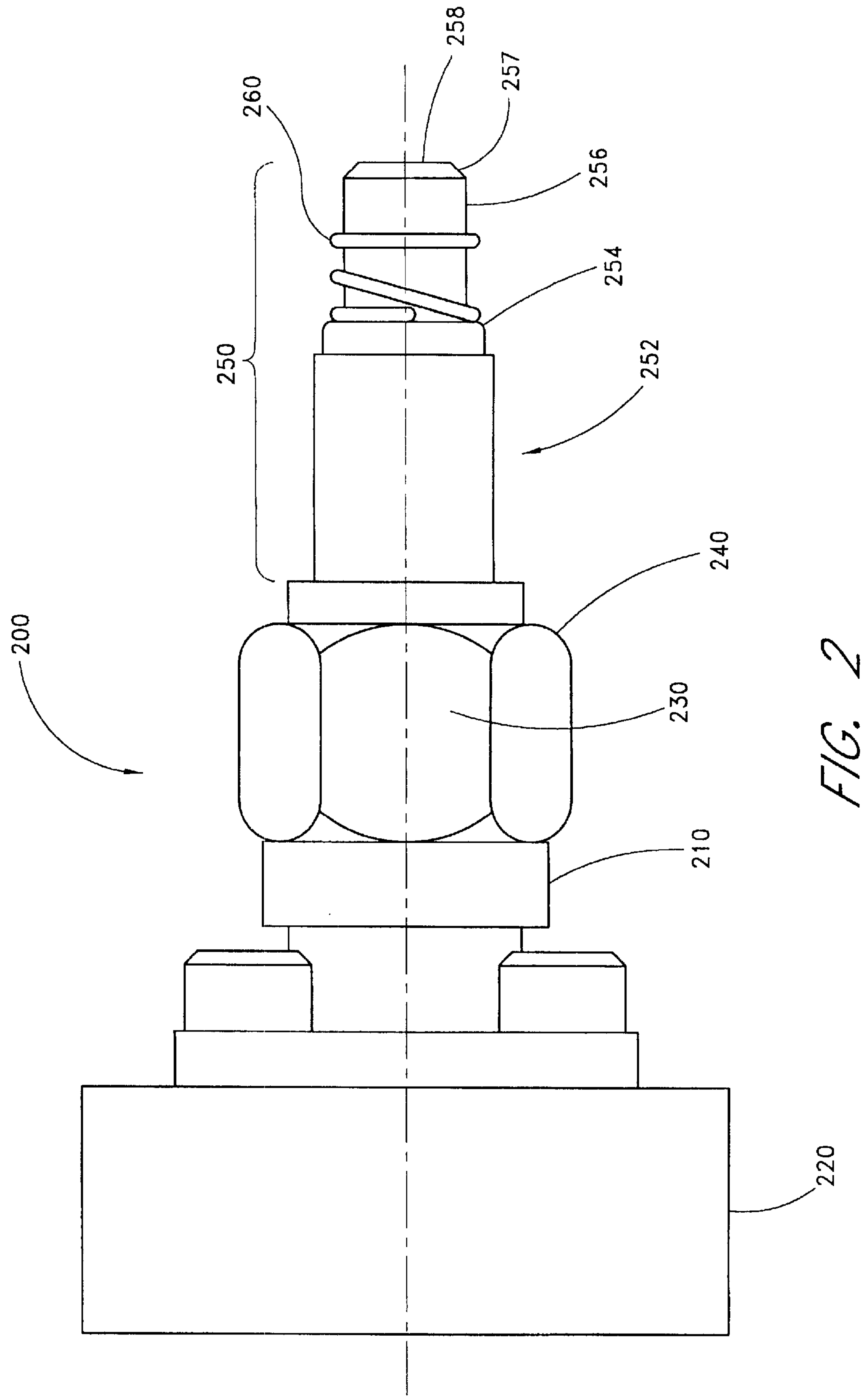
FIG. 2 is an elevational view of a test connector.

As discussed above, FIG. 1 depicts the prior art test connector 100 FIG. 2 depicts one embodiment of a test connector of the invention. Referring to the embodiment illustrated in FIG. 2, a test connector 200 has a cylindrical base 210 which is fixedly attached at one face to a connection port (not shown) on a unit of testing equipment 220. Mounted to the other face of the cylindrical base 210 is a body 230 surrounded by a connector saver 240. In one embodiment, the test connector 200 may be attached to the testing equipment 220 by manually screwing a threaded portion (not shown) of the cylindrical base 210 into a cylindrical opening of the connection port (not shown) in the testing equipment 220. In this embodiment, the cylindrical opening of the testing equipment 220 has similar dimensions to the threaded portion of the cylindrical base 210 and a threaded inner surface to accommodate the threaded portion of the cylindrical base 210. Moreover, in this embodiment, the body 230 can have multiple planar faces in order to allow a tool, such as an adjustable or customized wrench, to secure the body 230 and rotate the test connector 200, thereby allowing a user to install or to remove the test connector 200. Furthermore, the connector saver 240 can act to protect the action of a tool from damaging the test connector 200 when the test connector 200 is inserted or removed from the testing equipment 220.

As depicted in FIG. 2, a three-tiered cylindrical shaft 250 is affixed to the body 230. Each tier of the cylindrical shaft 250 has a decreasing diameter. The primary tier 252 has the largest diameter and is affixed to the body 230. The secondary tier 254 has a smaller diameter than primary tier 252 and is affixed to primary tier 252. The tertiary tier 256 has a smaller diameter than the secondary tier 254 and is affixed to the secondary tier 254. This three-tiered configuration allows the diameter of the cylindrical body 230 to be large enough to accommodate a manual manipulation of the connector 200 (such as with a tool) while also providing the smaller diameter of the tertiary tier 256 for insertion into a test port.

A helical grounding mechanism 260 encircles the tertiary tier 256. The shape of the grounding mechanism 260 allows the grounding mechanism 260 to serve both as a ground for the electrical connection between the test connector 200 and the test port of the wireless communication device under test and as a spring to improve the fit between the test connector 200 and the test port.

The leading edge 257 of the test connector 200 in FIG. 2 and the outer surface of the tertiary tip 256 form a beveled shoulder 258. In one embodiment, the shoulder 258 is beveled at an angle of 45 degrees. This configuration provides several advantages over the prior art. As described above and shown in FIG. 1, the leading edge 180 of the cylindrical tip 160 of the prior art test connector 100 forms a ninety degree angle with a plane tangential to the outer surface of the cylindrical shaft 150. The shape of the prior art test connector creates difficulty when inserting the prior art test connector in a mass production environment as discussed above. The beveled surface of the tertiary tip 256 of the test connector 200 described herein avoids these difficulties. The improved shape of the test connector 200 provides for a more uniform mechanical coupling and therefor a more uniform electrical connection. The grounding mechanism 260 also serves to guide and align the wireless communication device 275 to the test connector 200.

Figure 3B:
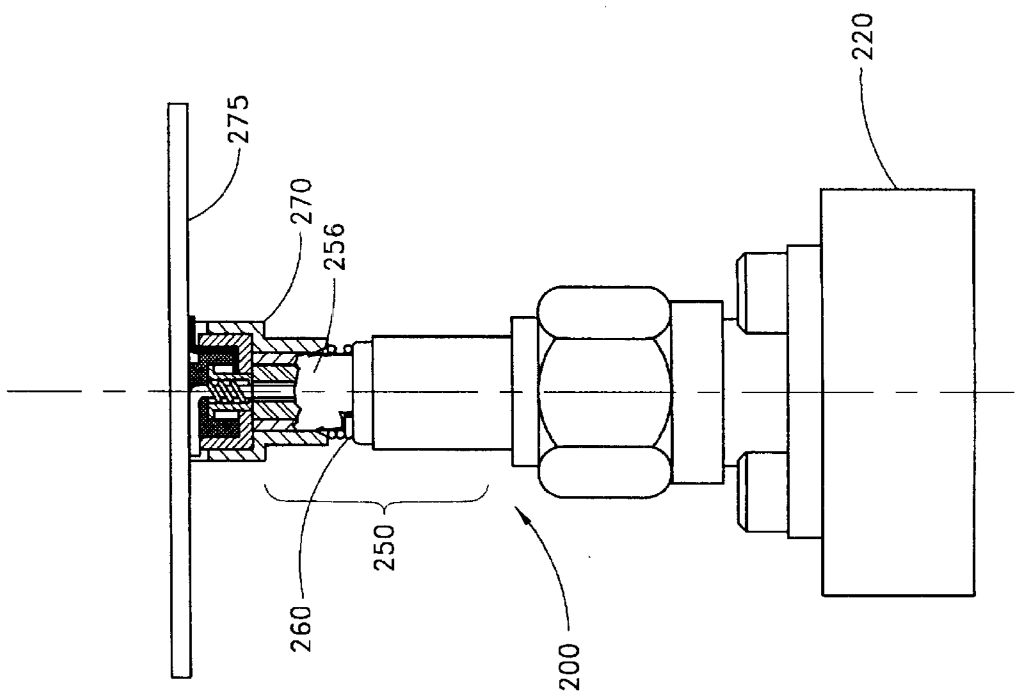
FIG. 3B is a partial cutaway elevational view of a test connector taken along lines 4—4 of FIG. 3A affixed to a test device as inserted into a test port of a wireless communicate device under test, wherein the test port is depicted in a cutaway view.
Figure 3A:
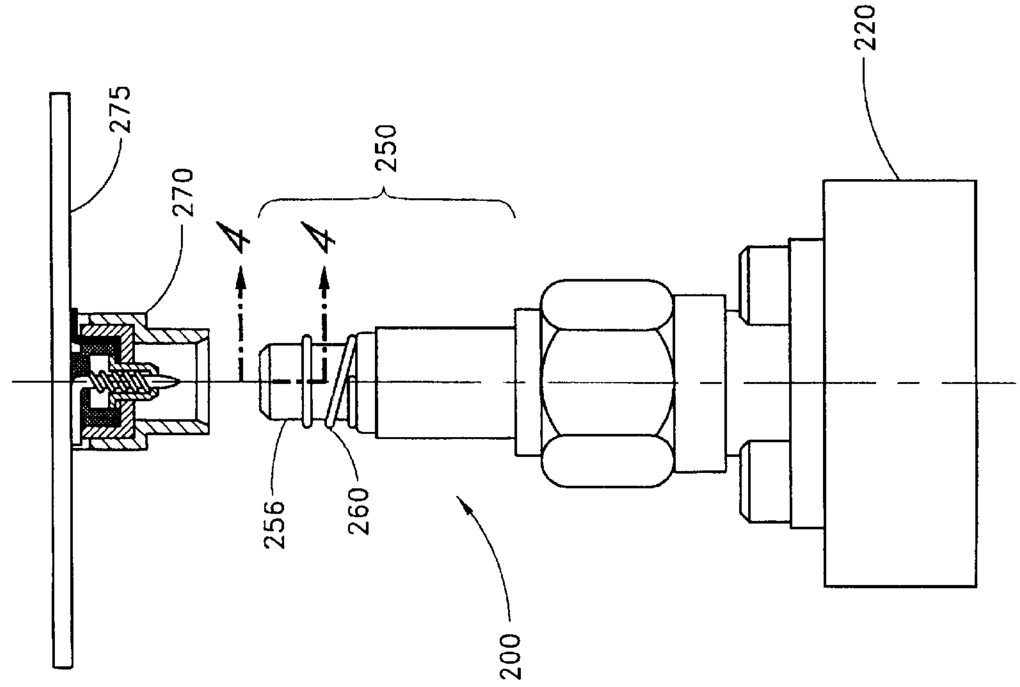
FIG. 3A is an elevational view of a test connector affixed to a test device prior to being inserted into a test port of a wireless communication device under test, wherein the test port is depicted in a cutaway view.

FIGS. 3A and 3B illustrate an embodiment of the test connector 200 prior to insertion into a test port 270 of a wireless communication device 275 and as inserted into a test port 270 of a wireless communication device 275, respectively. During the testing process, the tertiary tier 256 of the cylindrical shaft 250 is inserted into a test port 270 of a wireless communication device 275 under test as depicted in FIG. 3B. RF test signals are transmitted to the wireless communication device 275 under test via a transmitter passing through the center of the test connector 200 and through the leading edge 257 of the tertiary tier 256 of the cylindrical shaft 250. Once the test connector 200 is inserted into the test port 270 of the wireless communication device 275 under test, the tertiary tip 270 mates with the test port 270 to create an electrical connection and allow RF test signals to be transmitted to the wireless communication device 275 under test. As described in more detail below and illustrated in FIG. 4, the dimensions of the tertiary tip 256 correspond to the dimensions of the opening in the test port to permit a snug fit between the test connector 200 and the test port. The grounding mechanism 260 and the beveled shape of the tertiary tip 256 serve to guide the tertiary tip 270 into the test port during this mating process. Moreover, the various components of the test connector 200 define a hollow shaft whereby RF test signals can be transmitted to the wireless communication device 275 under test via a transmitter passing through the center of the test connector 200. In one embodiment, the electrical connection formed between the wireless communication device under test and the test connector 200 is a coaxial connection such as is well known in the art.

Figure 4:
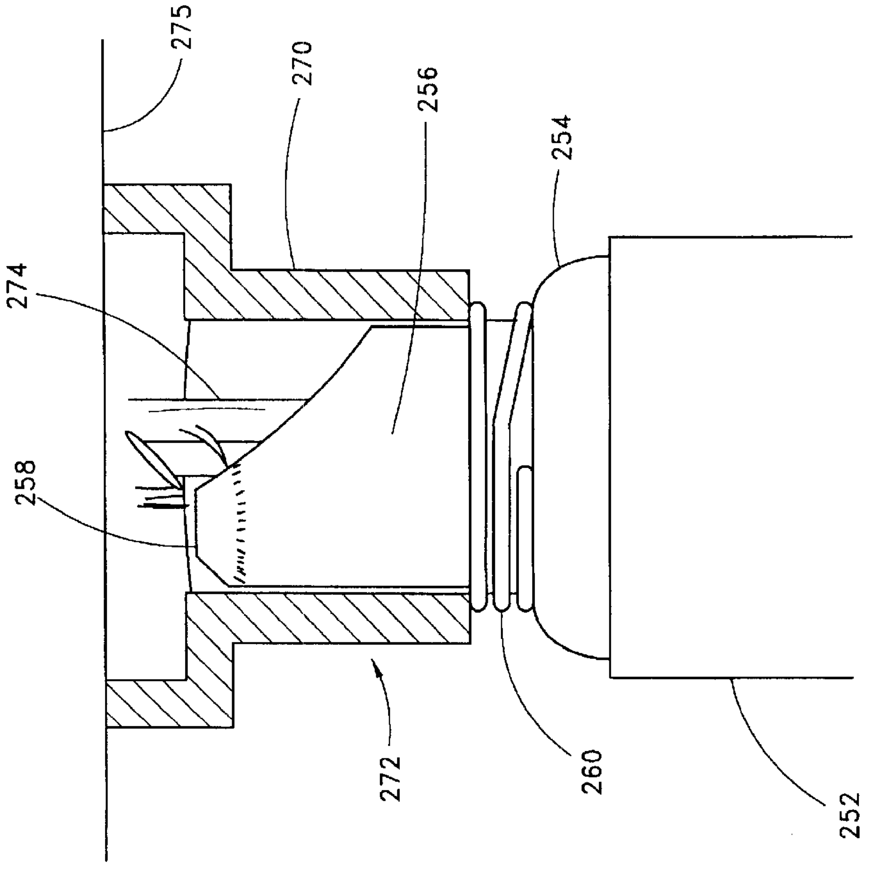
FIG. 4 is a partial cutaway elevation view of a test connector taken along lines 4—4 of FIG. 3A, illustrating the test connector as inserted into the test port of a device under test.

FIG. 4 shows a cut-away side view of the test connector 200 positioned in the test port 270 of the wireless communication device 275. As the tertiary tip 256 of the test connector 200 is inserted into the test port 270, the outer end of the wall 272 of the test port 270 presses against the grounding mechanism 260, reducing its helical shape to concentric rings encircling the base of the tertiary tip. At the same time, the receiver 274 of the test port 270, mates into the opening on the leading edge 257 of the tertiary tip 256. The diameter of the tertiary tip 270 corresponds to the inner diameter of the wall 272 of the test port 270. In addition to improving the mechanical mating of the test connector 200 and the test port 270 of the wireless communication device 275, the grounding mechanism 260 provides for direct and pressured contact between the wall 272 of the test port 270 and the grounding path of the test connector 200.

FIG. 4 also provides a basis for describing the improved performance produced by the test connector 200. In the embodiment of FIG. 2 and illustrated in FIG. 4 during insertion into the test port 270, the design of the test connector 200 incorporates a beveled tertiary tip 256 which allows for increased tolerance during initial placement of the test connector 200 into the test port. Furthermore, the test connector 200 includes a grounding mechanism 260 which also functions as a spring-like mechanism to guide and align the wireless communication device 275 to the test connector 200. The action of the grounding mechanism 270 at initial placement therefore helps to reduce misalignment between the test connector 200 and the test port 270.

Figure 5A:
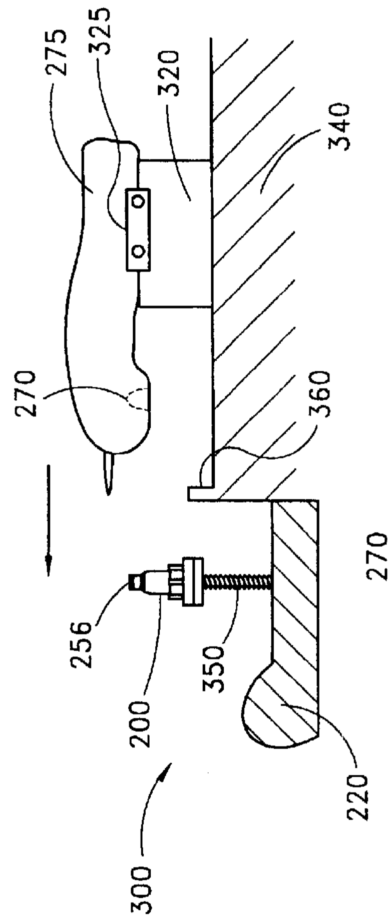
FIG. 5A is a side view of a device test system with a wireless communication device under test mounted to a moveable mechanism device prior to insertion of a test connector into a test port of the wireless communication device under test.
Figure 5B:
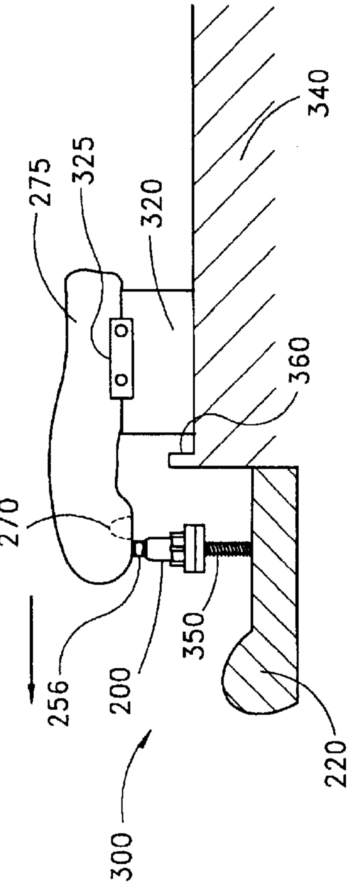
FIG. 5B is a side view of the device test system of FIG. 5A showing a compression spring under compression as the wireless communication device under test is moved into position for testing.
Figure 5C:
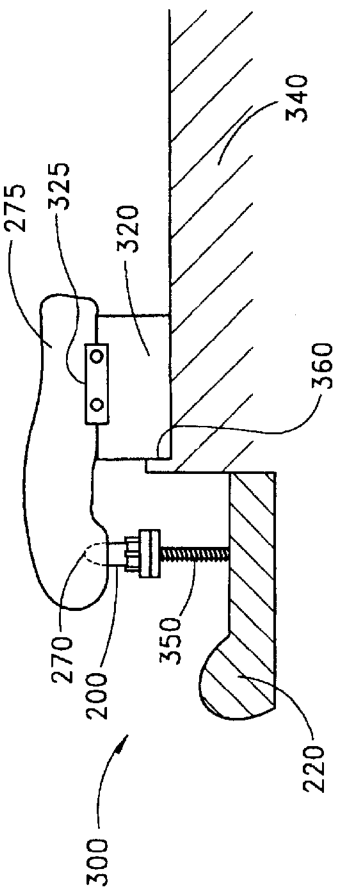
FIG. 5C is a side view of the device test system of FIG. 5A with the test connector fully inserted into the test port of the wireless communication device under test.

Referring now to FIGS. 5A, 5B, and 5C, a wireless communication device test system 300 is shown. The wireless communication device test system 300 includes a wireless communications device 275, which is mounted on a moveable mechanism 320. The moveable mechanism 320 is configured to have the capability to move horizontally along a foundation 340. As examples, a test table, a work bench, and a customized surface could serve as the foundation 340. Moreover, in one embodiment, the moveable mechanism 320 can be configured to move along a tracking mechanism (not shown) on the foundation 340. Furthermore, the moveable mechanism 320 is configured to secure the wireless communication device in position such that the test port 270 is at a height which corresponds to the height at which the test connector 200 is positioned above the foundation 340. In this embodiment, the moveable mechanism 320 can provide an attaching device 325 whereby an operator can securely attach the wireless communication device 275. Such an attaching device 325 could include straps, a locking device, an adjustable gripping device, or a slot conforming to the size and shape of the wireless communication device, as examples.

An operator can either manually move the wireless communication device 275 coupled with the moveable mechanism 320 or this action can occur automatically. In either case, the wireless communication device 275 coupled with the moveable mechanism 320 is moved towards the test connector 200 such that as the wireless communication device 275 passes over the test connector 200, the test connector 200 is inserted into the test port 270. The test connector 200 can be mounted on to a compression spring 350 positioned in the Z-axis so that the test connector 200 is flexible as the wireless communication device 275 is slid over the test connector 200.

In FIGS. 5A, 5B, and 5C, the test connector 200 is at a fixed position in the horizontal axis. The fixed position of the test connector 200 is located precisely so that when the wireless communication device 275 coupled to the moveable mechanism 320 reaches a travel stop 360, the test connector 200 is precisely positioned in the test port 270. Consequently, the tertiary tip 256 of the test connector 200 penetrates the horizontal plane extending from the lower surface of the wireless communication device 275. Therefore, as depicted in FIG. 5B, just prior to reaching the travel stop 360, the wireless communication device 275 mounted on the moveable mechanism 320 will come into contact with the test connector and depress the test connector 200 in the Z-axis direction which will in turn compress the compression spring 350. When the moveable mechanism 320 reaches the travel stop 360 as illustrated in FIG. 5C, the wireless communication device 275 will be in a position such that the opening of the test port 270 will receive the tertiary tip 256 of the test connector 200. In this position, the compression force on the compression spring 350 will be at least partially released allowing the compression spring 350 to push the test connector 200 back into the original Z-axis position and thereby cause the tertiary tip 256 to be inserted into and mate with the test port 270. When in this position, the connector 200 mates mechanically and electrically with the wireless communication device 275 through the test port 270.

One purpose of the test system 300 is to gather accurate test readings of the wireless communication device 275 at a production pace. To make the system more robust in this environment, human effort can be limited to mounting the wireless communication device 275 on to the moveable mechanism 320. After test readings have been collected, the operator can remove the test connector 200 from the test port 270 of the wireless communication device 275 simply by pressing the test connector 200 down vertically, thereby compressing the compression spring 350 and allowing the tertiary tip 256 of the test connector 200 to come out of the test port 270. Next, with the test connector 200 removed from the test port 270, the operator can slide the moveable mechanism 320 in the reverse direction away from the test connector 200. Once the wireless communication device 275 mounted on the moveable mechanism 320 has been moved horizontally away from the test connector, vertical downward pressure on the compression spring 350 can be released.

In another embodiment, human intervention can be limited further by automating the process. For example, an automated process could be used to slide the moveable mechanism 320 forward and backward. Moreover, an automated process could be used to secure the wireless communication device 275 to the moveable mechanism 320. Additionally, the testing process, including the beginning and ending of the transmission of the RF test signals, for example, could be automated as well.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning of equivalency of the claims are to be embraced within their scope.

What is claimed is:

1. A connector for providing a direct connection from a test port of a wireless communication device to be tested to a test device, the connector comprising:

a base attached to the test device and having a hollow center;

a body attached to the base and defining a shaft having a hollow center;

a tip portion attached to the body opposite the base and having a hollow center and a leading edge, wherein the tip portion is configured to mate with the test port;

a conductive material passing through the hollow centers of the base, the body, and the tip portion, wherein the conductive material provides an electrical coupling between the device to be tested and the test device when the tip portion is inserted into the test port; and a spring mechanism encircling the tip portion and configured to guide the tip portion into the test port during insertion.

2. The connector of claim 1, wherein the tip portion and the leading edge define a beveled configuration.

3. The connector of claim 1, wherein the base is cylindrical.

4. The connector of claim 1, wherein the body is cylindrical.

5. The connector of claim 1, wherein the spring mechanism defines a grounding path for the electrical coupling of the device to be tested with the test device when the tip portion is inserted into the test port.

6. The connector of claim 1, wherein the device to be tested is a wireless device.

7. The connector of claim 1, wherein the conductive material provides an electrical coupling with the test device in a coaxial configuration.

8. A system for testing devices, the system comprising:

a sub-system configured to perform a test;

a wireless communication device having a test port;

a connector electrically and mechanically coupled to the sub-system, the connector comprising:

a base attached to the sub-system and having a hollow center;

a body attached to the base and defining a shaft having a hollow center;

a tip portion attached to the body at a location substantially opposite the base and having a hollow center and a leading edge, wherein the tip portion is configured so as to mate with the test port;

a conductive material passing through the hollow centers of the base, the body, and the tip portion, wherein the conductive material provides an electrical coupling between the sub-system and the device, when the tip portion is inserted into the test port;

a spring mechanism encircling the tip portion and configured to guide the tip portion into the test port during insertion; and a moveable mechanism onto which the device is mounted, wherein the moveable mechanism and the device mounted thereto can be moved into a position such that the tip portion of the connector extends into and mates with the test port of the device.

9. The device test system of claim 8, wherein the device is a wireless device.

10. The device test system of claim 8, wherein the sub-system operates automatically.

11. The device test system of claim 8, wherein the moveable mechanism operates automatically.

12. The device test system of claim 8, wherein the tip portion and the leading edge define a beveled configuration.

13. The device test system of claim 8, wherein the base is cylindrical.

14. The device test system of claim 8, wherein the body is cylindrical.

15. The device test system of claim 8, wherein the spring mechanism defines a grounding path for the electrical coupling with the sub-system when the tip portion is inserted into the test port.

16. The device test system of claim 8, further comprising a compression spring joining the connector to the sub-system, whereby the compression spring permits vertical and horizontal movement of the connector as the device is moved into said position.

17. The device test system of claim 8, further comprising a flexible mechanism joining the connector to the sub-system, whereby the flexible mechanism permits vertical and horizontal movement of the connector as the device is moved into said position.

18. The device test system of claim 8, wherein the conductive material provides an electrical coupling with the sub-system in a coaxial configuration.

19. The device test system of claim 8, wherein the moveable mechanism comprises an attaching device for securing the device to the moveable mechanism.

20. The attaching device of claim 19, wherein the attaching device comprises a strapping device for securing the device to the moveable mechanism.

21. The attaching device of claim 19, wherein the attaching device comprises a mechanical device for securing the device to the moveable mechanism.

22. A connector for providing a direct connection from a test port of a wireless communication device to a test device, the connector comprising:

a base attached to the test device and having a hollow center;

a body attached to the base and defining a shaft having a hollow center;

a tip portion attached to the body opposite the base and having a hollow center and a leading edge, wherein the tip portion is configured to mate with the test port;

a conductive material passing through the hollow centers of the base, the body, and the tip portion, wherein the conductive material provides an electrical coupling between the wireless communication device and the test device when the tip portion is inserted into the test port; and a spring mechanism encircling the tip portion and configured to guide the tip portion into the test port during insertion.

23. The connector of claim 22, wherein the tip portion and the leading edge define a beveled configuration.

24. The connector of claim 22, wherein the base is cylindrical.

25. The connector of claim 22, wherein the body is cylindrical.

26. The connector of claim 22, wherein the spring mechanism defines a grounding path for the electrical coupling of the wireless communication device with the test device when the tip portion is inserted into the test port.

27. The connector of claim 22, wherein the conductive material provides an electrical coupling with the test device in a coaxial configuration.

* * * * *